(12) United States Patent
Ota et al.

(10) Patent No.: US 11,894,669 B2
(45) Date of Patent: Feb. 6, 2024

(54) POWER SOURCE CONTROL DEVICE, POWER SOURCE CONTROL METHOD, AND NON-TRANSITORY COMPUTER-READABLE RECORDING MEDIUM RECORDED WITH POWER SOURCE CONTROL PROGRAM

(71) Applicants: TOYOTA JIDOSHA KABUSHIKI KAISHA, Toyota (JP); DENSO TEN Limited, Kobe (JP)

(72) Inventors: Yuichi Ota, Toyota (JP); Kazuki Yamamoto, Kobe (JP); Junya Takano, Kobe (JP)

(73) Assignees: TOYOTA JIDOSHA KABUSHIKI KAISHA, Toyota (JP); DENSO TEN Limited, Kobe (JP)

( * ) Notice: Subject to any disclaimer, the term of this patent is extended or adjusted under 35 U.S.C. 154(b) by 222 days.

(21) Appl. No.: 17/650,103

(22) Filed: Feb. 7, 2022

(65) Prior Publication Data

US 2022/0320848 A1 Oct. 6, 2022

(30) Foreign Application Priority Data

Apr. 2, 2021 (JP) ................................ 2021-063575

(51) Int. Cl.
*H02H 3/00* (2006.01)
*H02H 3/05* (2006.01)
(Continued)

(52) U.S. Cl.
CPC ................. *H02H 3/05* (2013.01); *B60L 3/12* (2013.01); *G01R 19/0046* (2013.01);
(Continued)

(58) Field of Classification Search
CPC . H02H 3/05; H02H 3/08; H02J 7/0063; H02J 7/00714; G01R 19/0046; G01R 19/16576
(Continued)

(56) References Cited

U.S. PATENT DOCUMENTS

2018/0024196 A1 1/2018 Imura et al.
2019/0271743 A1 9/2019 Imura et al.
2021/0257676 A1* 8/2021 Takahashi ........ G01R 19/16576

FOREIGN PATENT DOCUMENTS

WO WO 2016/103721 A1 6/2016

* cited by examiner

*Primary Examiner* — Jared Fureman
*Assistant Examiner* — Lucy M Thomas
(74) *Attorney, Agent, or Firm* — Oblon, McClelland, Maier & Neustadt, L.L.P.

(57) ABSTRACT

A power source control device that includes: a make-and-break relay configured to either make or break conduction between a first terminal of a load and a first electrode of a direct current power source; a dark current generation circuit configured to generate a dark current by lowering a voltage of the direct current power source, in a state in which a first terminal is connected to the first electrode of the direct current power source and a second terminal is connected to the first terminal of the load so as to be parallel to the make-and-break relay; and a bypass circuit configured to dissipate some of power supplied from an external charger by making conduction between a second electrode of the direct current power source and the first terminal of the load in response to the direct current power source being charged by the external charger.

15 Claims, 8 Drawing Sheets

(51) Int. Cl.
*H02J 7/00* (2006.01)
*G01R 19/00* (2006.01)
*H02H 3/08* (2006.01)
*B60L 3/12* (2006.01)
*H02H 1/00* (2006.01)

(52) U.S. Cl.
CPC ............ *H02H 1/0007* (2013.01); *H02H 3/08* (2013.01); *H02J 7/0063* (2013.01); *H02J 7/00714* (2020.01)

(58) Field of Classification Search
USPC .......................................................... 361/87
See application file for complete search history.

FIG.8

| VOLTAGE DROP Vf | CURRENT VALUE Ia | BYPASS CIRCUIT | EXTERNAL CHARGER PRESENT | RELAY STATE | DETERMINATION RESULT |
|---|---|---|---|---|---|
| Vf ≥ PREDETERMINED VALUE | - | OFF | YES/NO | OPEN | OPEN RELAY OPERATING NORMALLY |
| Vf < PREDETERMINED VALUE | Ia ≥ PREDETERMINED VALUE | OFF | - | CLOSED | ANOMALY, CLOSED RELAY STUCK |
| - | Ia ≥ PREDETERMINED VALUE | ON | YES | OPEN | DETERMINE EXTERNAL CHARGER CONNECTED, STOP RELAY DIAGNOSIS |
| Vf ≥ PREDETERMINED VALUE | Ia < PREDETERMINED VALUE | ON | - | OPEN | OPEN RELAY OPERATING NORMALLY |
| Vf < PREDETERMINED VALUE | Ia < PREDETERMINED VALUE | ON | - | CLOSED | ANOMALY, CLOSED RELAY STUCK |

POWER SOURCE CONTROL DEVICE, POWER SOURCE CONTROL METHOD, AND NON-TRANSITORY COMPUTER-READABLE RECORDING MEDIUM RECORDED WITH POWER SOURCE CONTROL PROGRAM

CROSS-REFERENCE TO RELATED APPLICATION

This application is based on and claims priority under 35 USC 119 from Japanese Patent Application No. 2021-063575 filed on Apr. 2, 2021, the disclosure of which is incorporated by reference herein.

BACKGROUND

Technical Field

The present disclosure relates to a power source control device, a power source control method, and a non-transitory computer-readable recording medium recorded with a power source control program.

Related Art

In order to protect a circuit including an onboard power source such as a rechargeable battery, a make-and-break relay is sometimes provided between the power source and a load. An operating status of the make-and-break relay is diagnosed for example when the vehicle engine is started up.

International Publication (WO) No. 16/103,721 discloses a power source protection device, a power source device, and a switch fault diagnosis method that diagnose opening and closing of a make-and-break relay based on changes in circuit voltage.

However, in WO No. 16/103,721, the circuit voltage does not drop when an external charger is connected to the power source, and so it is difficult to determine whether or not the make-and-break relay is opening and closing normally.

SUMMARY

An aspect of the present disclosure is a power source control device that includes: a make-and-break relay configured to either make or break conduction between a first terminal of a load and a first electrode of a direct current power source; a dark current generation circuit configured to generate a dark current by lowering a voltage of the direct current power source, in a state in which a first terminal is connected to the first electrode of the direct current power source and a second terminal is connected to the first terminal of the load so as to be parallel to the make-and-break relay; and a bypass circuit configured to dissipate some of power supplied from an external charger by making conduction between a second electrode of the direct current power source and the first terminal of the load in response to the direct current power source being charged by the external charger.

BRIEF DESCRIPTION OF DRAWINGS

FIG. 8 is an explanatory diagram illustrating an example of determination conditions for a make-and-break relay of a power source control device according to an exemplary embodiment.

DETAILED DESCRIPTION

Figure 1:
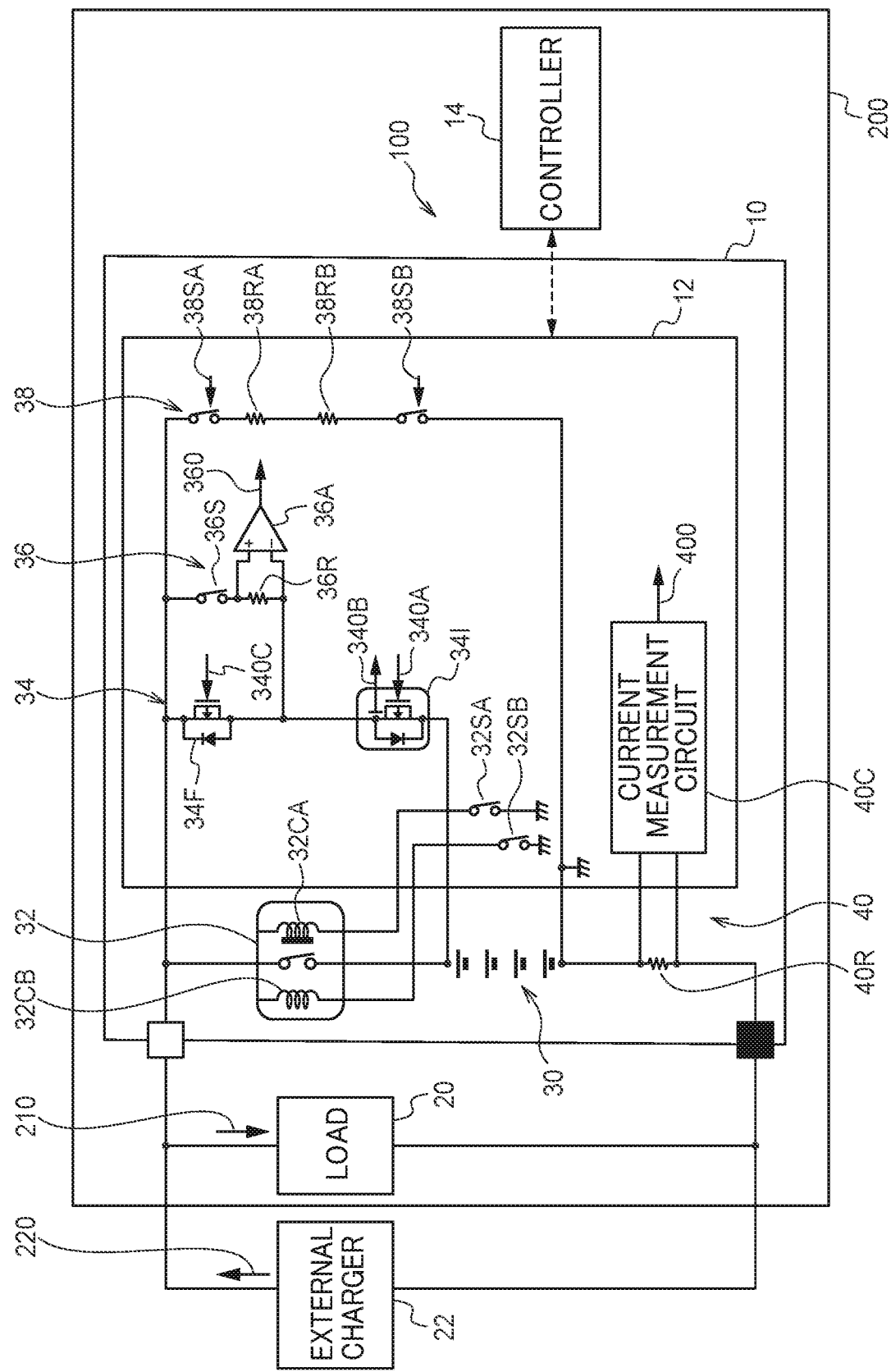
FIG. 1 is a block diagram illustrating an example of a power source control device according to an exemplary embodiment.

Explanation follows regarding a power source control device 100 according to an exemplary embodiment, with reference to FIG. 1. The power source control device 100 illustrated in FIG. 1 is installed to a vehicle 200, and includes functionality to diagnose an operating state of a make-and-break relay 32. The make-and-break relay 32 is connected to a power source 30, this being a direct current power source that is capable of charging and discharging. Power from the power source 30 is supplied as a current 210 to a load 20 inside the vehicle 200. In cases in which an abnormal current or the like has occurred, a contact point of the make-and-break relay 32 is switched to an open state in order to protect the circuit by breaking the supply of power from the power source 30 to the load 20.

The power source 30 is a rechargeable battery or the like that is capable of charging and discharging. As an example, a lead-acid battery, a nickel-metal hydride battery, a NiCad battery, or a lithium-ion battery may be employed therefor.

As illustrated in FIG. 1, the make-and-break relay 32 includes a coil 32CA and a coil 32CB. The coil 32CA is excited when a switch 32SA is switched ON, and the coil 32CB is excited when a switch 32SB is switched ON. For example, when the switch 32SA is switched ON and the switch 32SB is switched ON, the make-and-break relay 32 is in an open state. When the switch 32SA is switched OFF and the switch 32SB is switched ON, the make-and-break relay 32 is in a closed state. Current resulting from the power source 30 is detected by a current sensor 40. The current sensor 40 is configured by a shunt resistor 40R and a current measurement circuit 40C. The current measurement circuit 40C computes a current value resulting from the power source 30 based on a potential difference between both terminals of the shunt resistor 40R, and outputs a computed current value 400 to a controller 14, described later.

In addition to the current sensor 40, the power source control device 100 also includes a dark current generation circuit 34 that conducts current from the power source 30 to the load 20 and so on when the make-and-break relay 32 is in the open state, a monitor circuit 36 that monitors a conducting state of the dark current generation circuit 34, and a bypass circuit 38. When an external charger 22 is connected to the vehicle 200 circuit and a current 220 flows from the external charger 22 to the vehicle 200 circuit, the bypass circuit 38 is switched ON so as to handle the effect of the current 220 while the state of the make-and-break relay 32 is being diagnosed.

The dark current generation circuit 34 is provided in parallel to the make-and-break relay 32. The dark current generation circuit 34 includes an intelligent power device (IPD) 34I and a switching element 34F such as a field effect transistor. The IPD 34I is a semiconductor switch with an inbuilt protection circuit that has a first terminal connected between a positive electrode of the power source 30 and a first terminal of the make-and-break relay 32, and a second terminal connected to a drain of the switching element 34F. The switching element 34F has the drain connected to the second terminal of the IPD 34I, and a source connected to a second terminal of the make-and-break relay 32 and a first terminal of the load 20.

The IPD 34I is set to an ON state when applied with a control signal 340A. For example, if an abnormal current were to occur due to a short circuit, the IPD 34I would absorb load due to this abnormal current using the inbuilt protection circuit, and output a signal 340B indicating that an anomaly has occurred to the controller 14.

The switching element 34F is switched ON by a control signal 340C applied to a gate thereof. The switching element 34F functions as a type of variable resistor by being used in a linear region where conductivity is adjusted according to a voltage value of the control signal 340C applied to the gate thereof.

The IPD 34I is a switch that is switched ON to supply dark current to the vehicle 200 circuit when an ignition switch, power switch, or the like of the vehicle 200 is in an OFF state. The switching element 34F acts as a resistor that lowers voltage from the power source 30 so as to become the dark current.

The monitor circuit 36 includes a resistor 36R, a switch 36S, and an amplifier 36A. The resistor 36R has a first terminal connected to the second terminal of the IPD 34I. The switch 36S has a first terminal connected to a second terminal of the resistor 36R, and a second terminal connected to the source of the switching element 34F, the second terminal of the make-and-break relay 32, and the first terminal of the load 20. The amplifier 36A amplifies a potential difference between both terminals of the resistor 36R.

When the switch 36S of the monitor circuit 36 is switched ON, a potential difference arises between both terminals of the resistor 36R. The potential difference that has arisen is amplified by the amplifier 36A, and output to the controller 14 as a voltage value 360.

The bypass circuit 38 is provided in parallel with the power source 30 and the make-and-break relay 32. The bypass circuit 38 includes a switch 38SA, a resistor 38RA, a resistor 38RB, and a switch 38SB that are connected in direct series. A first terminal of the switch 38SB is connected to a negative electrode of the power source 30. A first terminal of the switch 38SA is connected to the second terminal of the switch 36S, the source of the switching element 34F, and the second terminal of the make-and-break relay 32. In cases in which the controller 14 determines that the external charger 22 has been connected to the vehicle 200 circuit, the controller 14 switches the switches 38SA, 38SB of the bypass circuit 38 ON, such that excess power is dissipated by the resistors 38RA, 38RB and the effect of the current 220 is suppressed.

The current measurement circuit 40C, the dark current generation circuit 34, the monitor circuit 36, and the bypass circuit 38 described above configure a power source monitoring unit 12. The power source 30 and the power source monitoring unit 12 configure a power source unit 10.

Figure 2:
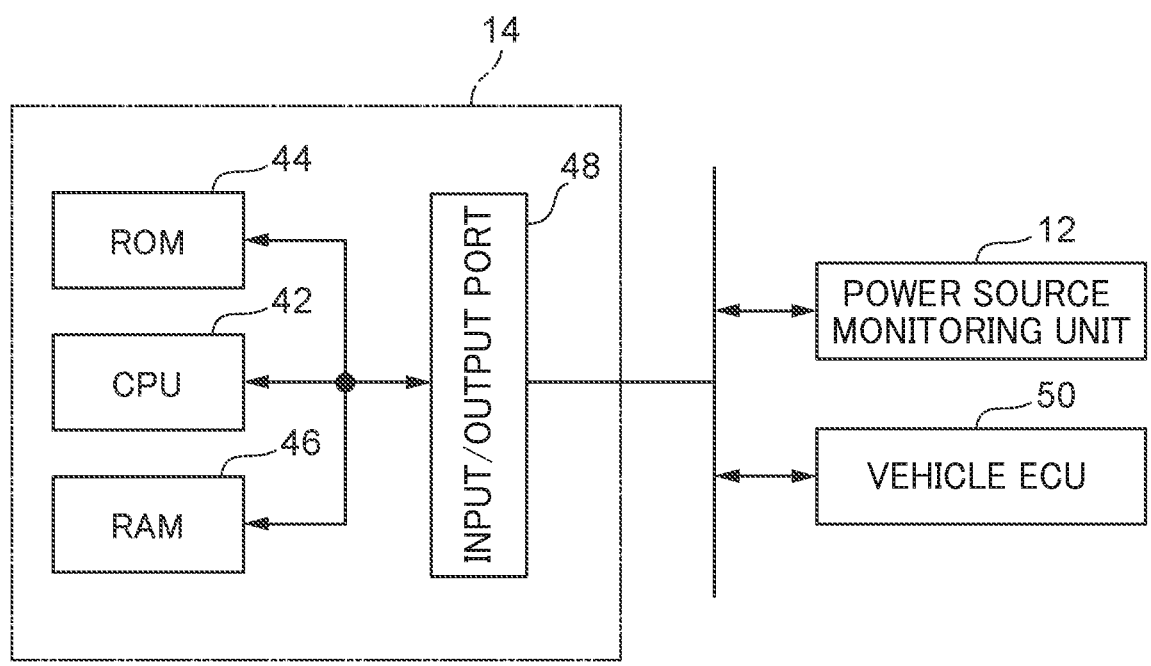
FIG. 2 is a block diagram illustrating an example of a hardware configuration of a controller according to an exemplary embodiment.

FIG. 2 is a block diagram illustrating an example of a hardware configuration of the controller 14 according to the present exemplary embodiment. The controller 14 is a type of computer that includes a central processing unit (CPU) 42 serving as an example of a hardware processor, read only memory (ROM) 44, random access memory (RAM) 46, and an input/output port 48.

The CPU 42, the ROM 44, the RAM 46, and the input/output port 48 of the controller 14 are connected together through various buses, including an address bus, a data bus, and a control bus. The power source monitoring unit 12, a vehicle electronic control unit (ECU) 50 that controls the load 20 and so on of the vehicle 200, and the like are respectively connected to the input/output port 48.

By executing a power source control program, the CPU 42 of the controller 14 exhibits a determination function of determining a state of the make-and-break relay 32 and whether or not the power source 30 is being charged by an external charger based on the potential difference detected by the monitor circuit 36 and the current detected by the current sensor 40, and also exhibits a switch control function of controlling various switches including the make-and-break relay 32. When the CPU 42 loads and executes the program including this functionality, the CPU 42 functions as a determination section and a switch controller.

This program may be stored in the ROM 44, RAM 46, or the like, or stored in a non-transitory recording medium such as a HDD or SSD and loaded by the CPU 42 through the RAM 46. Alternatively, the program may be stored in an external server and loaded over a network by the CPU 42 through the RAM 46.

Figure 3:
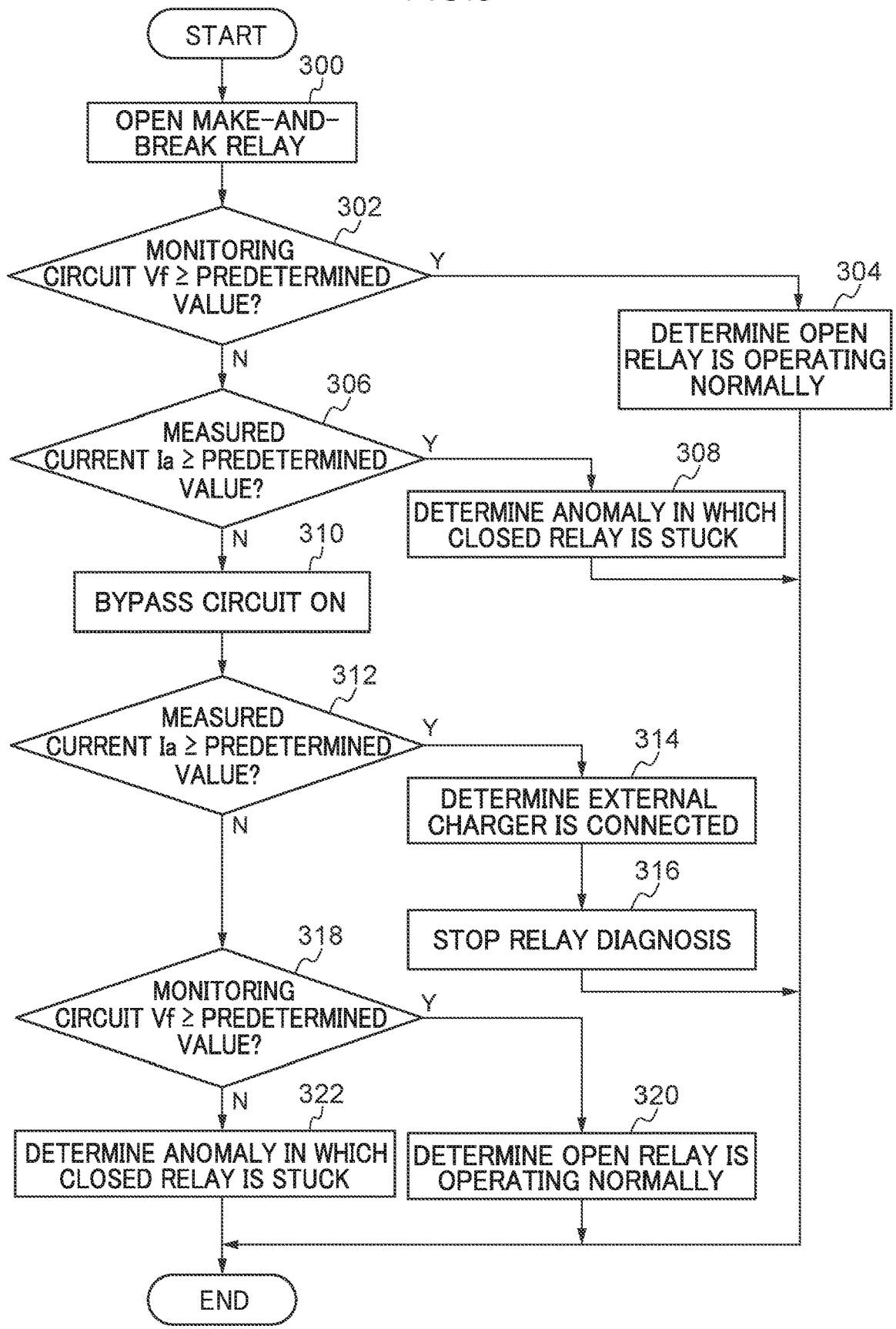
FIG. 3 is a flowchart illustrating an example of processing by a controller of a power source control device according to an exemplary embodiment.

FIG. 3 is a flowchart illustrating an example of processing by the controller 14 of the power source control device 100 according to the present exemplary embodiment. The processing illustrated in FIG. 3 starts when the ignition switch or power switch of the vehicle 200 is switched ON.

At step 300, the make-and-break relay 32 is set to the open state. When the make-and-break relay 32 is set to the open state, the IPD 34I and the switching element 34F are switched ON such that the dark current generation circuit 34 is in a conducting state. Note that if dark current has been supplied to the vehicle 200 in a state in which the ignition switch or power switch was OFF, the IPD 34I and the switching element 34F are already switched ON.

Figure 4:
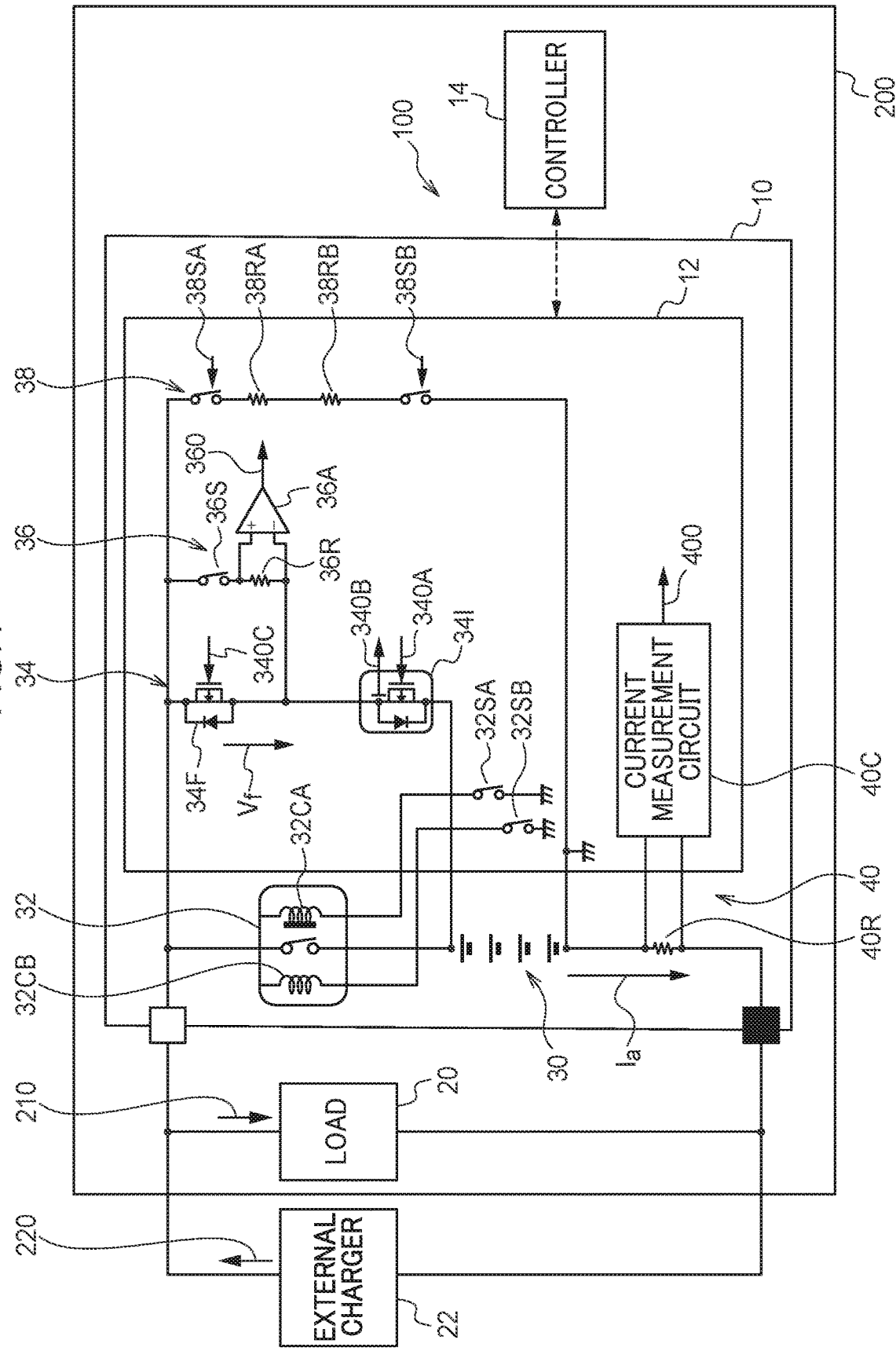
FIG. 4 is an explanatory diagram illustrating a case in which a make-and-break relay is in an open state, and a voltage drop has occurred due to a dark current generation circuit.

When the make-and-break relay 32 is set to the open state, a voltage drop $V_f$ occurs in the dark current generation circuit 34, as illustrated in FIG. 4. This is because current from the power source 30 does not flow through the make-and-break relay 32 in the open state to the load 20-side of the circuit, but instead dark current is supplied to the load 20-side of the circuit through the switching element 34F that lowers the voltage from the power source 30. The current sensor 40 detects a current $I_a$ regardless of whether the make-and-break relay 32 is in the open state or the closed state. The current $I_a$ increases when the make-and-break relay 32 is in the closed state, and decreases in a state in which current flows through the dark current generation circuit 34 that has a larger resistance value than the make-and-break relay 32 when the make-and-break relay 32 is in the open state.

At step 302, determination is made as to whether or not a voltage drop $V_f$ detected by the monitor circuit 36 while the switch 36S is ON is a predetermined threshold voltage or greater. The predetermined threshold voltage is estimated based on the circuit configuration, and decided based on actual testing.

In cases in which the voltage drop $V_f$ detected by the monitor circuit 36 is the predetermined threshold voltage or greater at step 302, determination is made at step 304 that the make-and-break relay 32 is operating normally in the open state, and the processing is ended.

In cases in which the voltage drop $V_f$ detected by the monitor circuit 36 is less than the predetermined threshold voltage at step 302, determination is made at step 306 as to whether or not the current $I_a$ measured by the current sensor 40 is a predetermined threshold current or greater. The predetermined threshold current is estimated based on the circuit configuration, and decided based on actual testing.

In cases in which the current $I_a$ measured by the current sensor 40 is the predetermined threshold current or greater at step 306, determination is made at step 308 that an anomaly has arisen in which the make-and-break relay 32 is stuck in the closed state, and the processing is ended.

Figure 5:
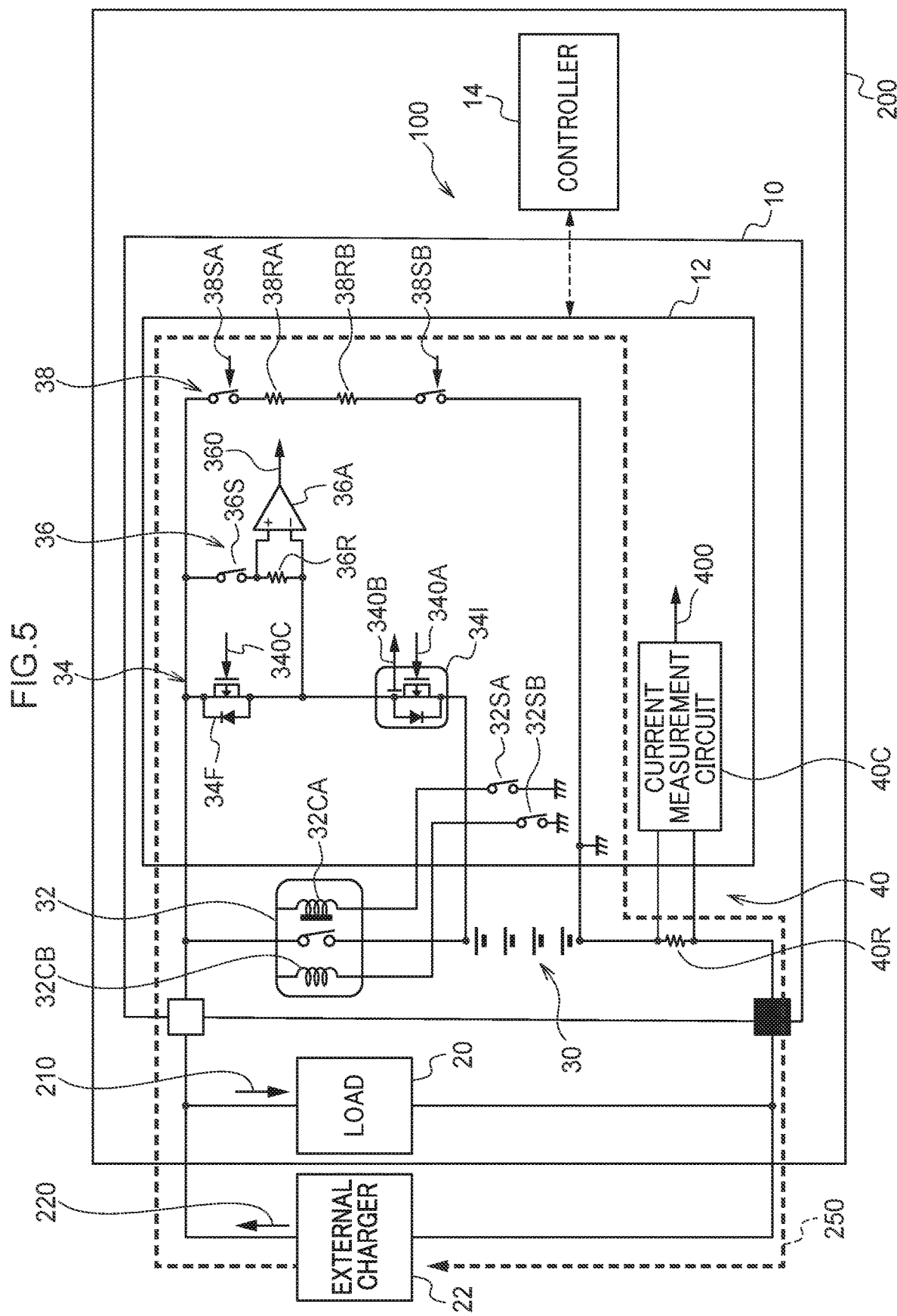
FIG. 5 is an explanatory diagram illustrating an example of current in a case in which a bypass circuit is in a conductive state.

In cases in which the current $I_a$ measured by the current sensor 40 is less than the predetermined threshold current at step 306, there is a possibility that the power source 30 is being charged by the external charger 22, and so the switches 38SA, 38SB are both switched ON at step 310 such that the bypass circuit 38 is set to a conductive state. When the bypass circuit 38 is set to a conductive state while the external charger 22 is connected to the vehicle 200 circuit and is supplying power, a current 250 flows in the vehicle 200 circuit as illustrated in FIG. 5.

At step 312, determination is made as to whether or not the current $I_a$ measured by the current sensor 40 is the predetermined threshold current or greater.

In cases in which the current $I_a$ measured by the current sensor 40 is the predetermined threshold current or greater at step 312, determination is made at step 314 that the external charger 22 is connected. Then, at step 316, determination of the state of the make-and-break relay 32 is stopped and the processing is ended.

At step 318, determination is made as to whether or not the voltage drop $V_f$ detected by the monitor circuit 36 is the predetermined threshold voltage or greater. When power is supplied from the external charger 22 to the circuit including the power source 30, the voltage on the load 20-side terminal of the switching element 34F configuring the dark current generation circuit 34 rises, such that the potential difference between both terminals of the switching element 34F is reduced, and the voltage drop $V_f$ is suppressed. However, causing power supplied from the external charger 22 to flow in the bypass circuit 38 enables some of this power to be dissipated by the resistors 38RA, 38RB configuring the bypass circuit 38. This enables a rise in the voltage on the load 20-side terminal of the switching element 34F configuring the dark current generation circuit 34 to be suppressed.

Figure 6:
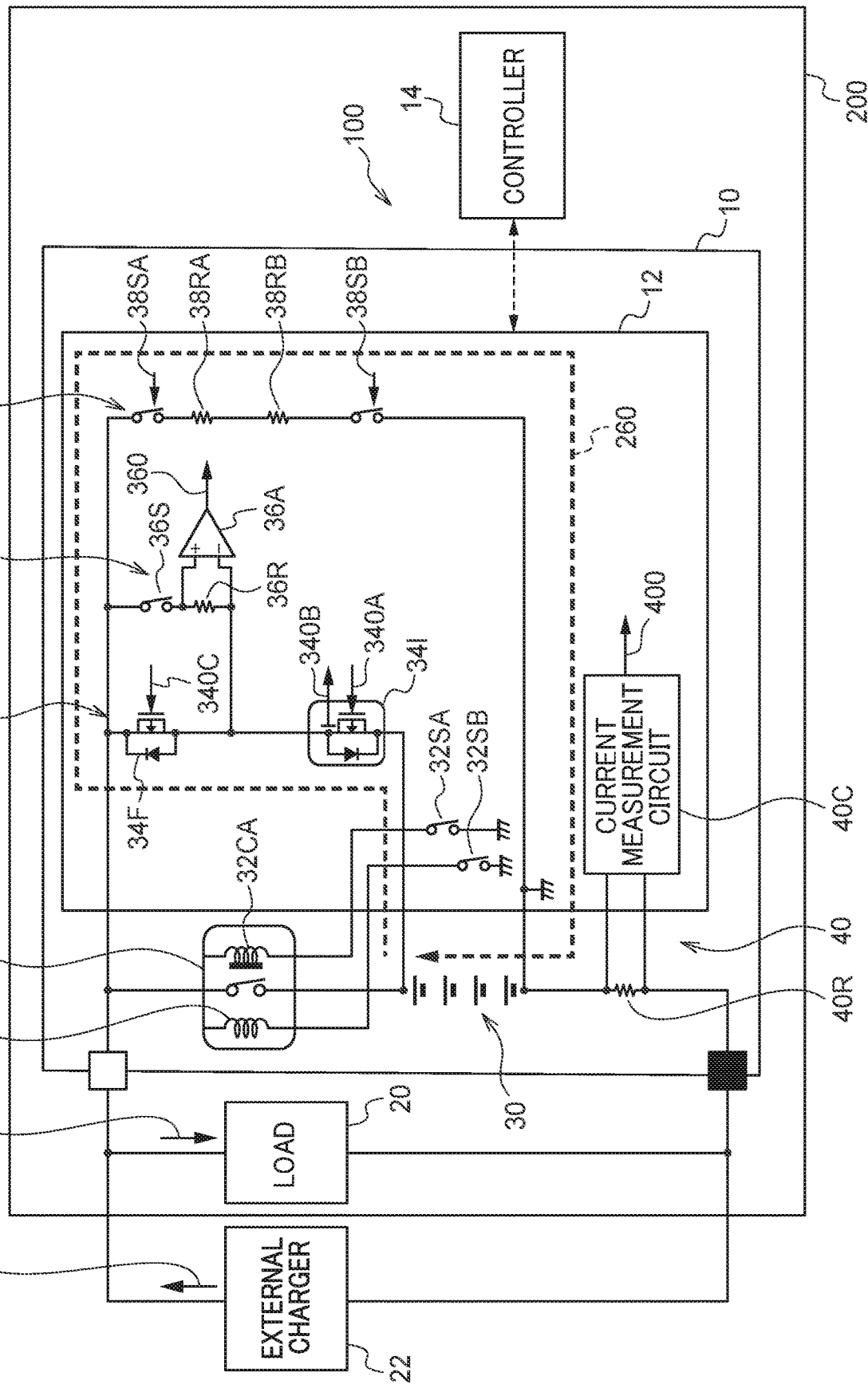
FIG. 6 is an explanatory diagram illustrating an example of current in a case in which a voltage drop is a predetermined threshold voltage or greater while a bypass circuit is in a conductive state.

In cases in which the voltage drop $V_f$ detected by the monitor circuit 36 is the predetermined threshold voltage or greater at step 318, determination is made at step 320 that the make-and-break relay 32 is operating normally in the open state, and the processing is ended. In cases in which the voltage drop $V_f$ detected by the monitor circuit 36 is the predetermined threshold voltage or greater, a current 260 flows in the power source control device 100 circuit as illustrated in FIG. 6.

Figure 7:
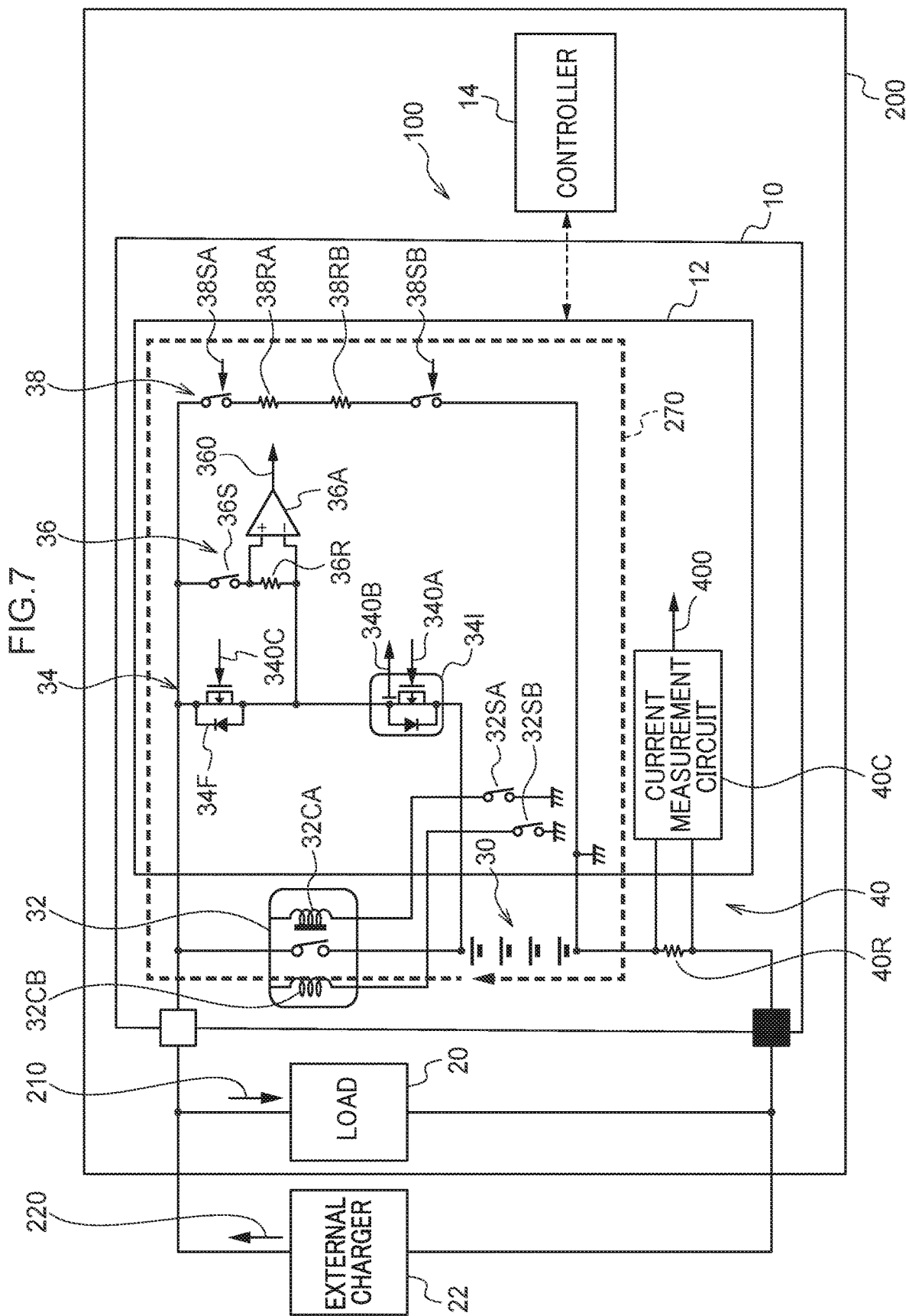
FIG. 7 is an explanatory diagram illustrating an example of current in a case in which a voltage drop is less than a predetermined threshold voltage while a bypass circuit is in a conductive state.

In cases in which the voltage drop $V_f$ detected by the monitor circuit 36 is less than the predetermined threshold voltage at step 318, determination is made at step 322 that an anomaly has arisen in which the make-and-break relay 32 is stuck in the closed state, and the processing is ended. In cases in which the voltage drop $V_f$ detected by the monitor circuit 36 is less than the predetermined threshold voltage, a current 270 flows in the circuit of the power source control device 100 as illustrated in FIG. 7, such that the voltage on the load 20-side terminal of the switching element 34F configuring the dark current generation circuit 34 is more likely to rise.

FIG. 8 is an explanatory diagram illustrating an example of determination conditions for the make-and-break relay 32 of the power source control device 100 according to the present exemplary embodiment. The determination conditions are the extent of the voltage drop $V_f$, the size of the current $I_a$, whether the bypass circuit 38 is ON or OFF, and whether or not the external charger 22 is present.

In cases in which the voltage drop $V_f$ is the predetermined threshold voltage or greater and the bypass circuit 38 is OFF, determination is made that the make-and-break relay 32 is operating normally in the open state, regardless of whether or not the external charger 22 is present.

In cases in which the voltage drop $V_f$ is less than the predetermined threshold voltage, the size of the current $I_a$ corresponds to the predetermined threshold current or greater, and the bypass circuit 38 is OFF, determination is made that an anomaly has arisen in which the make-and-break relay 32 is stuck in the closed state.

Regardless of the value of the voltage drop $V_f$, in cases in which the size of the current $I_a$ corresponds to the predetermined threshold current or greater and the bypass circuit 38 is ON with the external charger 22 present, determination is made that the external charger 22 is connected. However, in such cases it would be difficult to accurately determine the state of the make-and-break relay 32 and so determination of the state of the make-and-break relay 32 is stopped.

In cases in which the voltage drop $V_f$ is the predetermined threshold voltage or greater, the size of the current $I_a$ corresponds to less than the predetermined threshold current, and the bypass circuit 38 is ON, determination is made that the make-and-break relay 32 is operating normally in the open state.

In cases in which the voltage drop $V_f$ is less than the predetermined threshold voltage, the size of the current $I_a$ corresponds to less than the predetermined threshold current, and the bypass circuit 38 is ON, determination is made that an anomaly has arisen in which the make-and-break relay 32 is stuck in the closed state.

As described above, in the present exemplary embodiment, in cases in which the voltage drop $V_f$ by the dark current generation circuit 34 of the power to charge the power source 30 using the external charger 22 is possibly being suppressed, some of the power supplied by the external charger 22 is dissipated by the bypass circuit 38 including the resistors 38RA, 38RB. This dissipation of power makes the voltage drop $V_f$ by the dark current generation circuit 34 more apparent, thereby enabling determination that the make-and-break relay 32 is in the open state.

Moreover, in a state in which some of the power supplied by the external charger 22 has been dissipated by the bypass circuit 38, determination can be made not only regarding the state of the make-and-break relay 32, but also regarding whether or not the power source 30 is being charged by the external charger 22, based on the detected voltage drop $V_f$ and the detected current $I_a$.

Although the make-and-break relay 32, the dark current generation circuit 34, and so on are connected to the positive electrode of the power source 30 in the present exemplary embodiment, there is no limitation thereto. The polarity of the power source 30 may be inverted with respect to the state illustrated in FIG. 1 and so on, such that the make-and-break relay 32, the dark current generation circuit 34, and so on are connected to the negative electrode of the power source 30. In cases in which the polarity of the power source 30 is inverted, the polarity of the external charger 22, the load 20, the switching element 34F, and so on may also be inverted with respect to the state illustrated in FIG. 1 and so on as required.

The power source 30 corresponds to a "direct current power source", the make-and-break relay 32 corresponds to a "first switcher", the monitor circuit 36 corresponds to a "voltage detection section", the current sensor 40 corresponds to a "current detection section", the switches 38SA, 38SB correspond to a "second switcher", and the resistors 38RA, 38RB correspond to a "resistor".

Note that the processing executed by the CPU 42 loading software (a program) in the above exemplary embodiment may be executed by various types of processor other than a CPU. Such processors include programmable logic devices (PLD) that allow circuit configuration to be modified post-manufacture, such as a field-programmable gate array (FPGA), and dedicated electric circuits, these being processors including a circuit configuration custom-designed to execute specific processing, such as an application specific integrated circuit (ASIC). The processing may be executed by any one of these various types of processor, or by a combination of two or more of the same type or different types of processor (such as plural FPGAs, or a combination of a CPU and an FPGA). The hardware structure of these various types of processors is more specifically an electric circuit combining circuit elements such as semiconductor elements.

An object of the present disclosure is to obtain a power source control device, a power source control method, and a non-transitory computer-readable recording medium recorded with a power source control program that enable an operating diagnosis of a make-and-break relay to be performed, even in a state in which an external charger is connected.

A first aspect of the present disclosure is a power source control device that includes: a make-and-break relay configured to either make or break conduction between a first terminal of a load and a first electrode of a direct current power source; a dark current generation circuit configured to generate a dark current by lowering a voltage of the direct current power source, in a state in which a first terminal is connected to the first electrode of the direct current power source and a second terminal is connected to the first terminal of the load so as to be parallel to the make-and-break relay; and a bypass circuit configured to dissipate some of power supplied from an external charger by making conduction between a second electrode of the direct current power source and the first terminal of the load in response to the direct current power source being charged by the external charger.

In the power source control device of the first aspect, dissipating some of the power supplied from the external charger using the bypass circuit enables an operating diagnosis of a first switcher configuring the make-and-break relay to be performed, even in a state in which the external charger is connected.

A second aspect of the present disclosure is the power source control device of the first aspect, that further includes: a memory; and a processor coupled to the memory, the processor being configured to: detect a potential difference between the second terminal and the first terminal of the dark current generation circuit, detect a current between a second terminal of the load and the second electrode of the direct current power source, and control the make-and-break relay so as to make or break conduction, and determine a state of the make-and-break relay based on the potential difference and the current that have been detected.

In the power source control device of the second aspect, the state of the first switcher can be determined based on the potential difference between the second terminal and the first terminal of the dark current generation circuit and on the current between the second terminal of the load and the second electrode of the direct current power source.

A third aspect of the present disclosure is the power source control device of the second aspect, wherein the processor is configured to determine that the make-and-break relay is in an open state in response to the detected potential difference being a predetermined threshold voltage or greater.

A fourth aspect of the present disclosure is the power source control device of the second aspect, wherein the processor is configured to determine that the make-and-break relay is stuck in a closed state in response to the detected potential difference being less than a predetermined threshold voltage and the detected current being a predetermined threshold current or greater.

A fifth aspect of the present disclosure is the power source control device of the second aspect, wherein: the bypass circuit includes a switch that makes or breaks conduction between the first terminal of the load and the second electrode of the direct current power source, and a resistor that dissipates some of the conducted power; and the processor is configured to, in response to the detected potential difference being less than a predetermined threshold voltage and the detected current being less than a predetermined threshold current, make conduction between the second electrode of the direct current power source and the first terminal of the load by turning on the switch.

A sixth aspect of the present disclosure is the power source control device of the fifth aspect, wherein the processor is configured to determine that charging of the direct current power source is being performed by the external charger in response to the detected current being the predetermined threshold current or greater, in a state in which the bypass circuit is conducting between the second electrode of the direct current power source and the first terminal of the load.

A seventh aspect of the present disclosure is the power source control device of the fifth aspect, wherein the processor is configured to determine that the make-and-break relay is in an open state in response to the detected current being less than the predetermined threshold current and the detected potential difference being the predetermined threshold voltage or greater, in a state in which the bypass circuit is conducting between the second electrode of the direct current power source and the first terminal of the load.

An eighth aspect of the present disclosure is the power source control device of the fifth aspect, wherein the processor is configured to determine that the make-and-break relay is stuck in a closed state in response to the detected current being less than the predetermined threshold current and the detected potential difference being less than the predetermined threshold voltage, in a state in which the bypass circuit is conducting between the second electrode of the direct current power source and the first terminal of the load.

A ninth aspect of the present disclosure is a power source control method that includes: by a processor, detecting a potential difference between a second terminal and a first terminal of a dark current generation circuit, the dark current generation circuit being configured to generate a dark current by lowering a voltage of a direct current power source in a state in which the first terminal of the dark current generation circuit is connected to a first electrode of the direct current power source and the second terminal of the dark current generation circuit is connected to a first terminal of a load, so as to be parallel to a make-and-break relay configured to either make or break conduction between the first terminal of the load and the first electrode of the direct current power source; detecting a current between a second terminal of the load and a second electrode of the direct current power source; determining a state of the make-and-break relay based on the potential difference and the current; setting a conductive state for a bypass circuit that is configured to dissipate some of power supplied from an external charger in a state of conduction between the second electrode of the direct current power source and the first terminal of the load in response to the potential difference being less than a predetermined threshold voltage and the current being less than a predetermined threshold current; and determining a state of the make-and-break relay and whether or not the direct current power source is being charged by the external charger based on the detected potential difference between the second terminal and the first terminal of the dark current generation circuit and the detected current between the second terminal of the load and the second electrode of the direct current power source in response to a conductive state being in place between the second electrode of the direct current power source and the first terminal of the load due to the bypass circuit.

In the power source control method of the ninth aspect, dissipating some of the power supplied from the external charger using the bypass circuit enables an operating diagnosis of the first switcher configuring the make-and-break relay to be performed, even in a state in which the external charger is connected.

A tenth aspect of the present disclosure is a non-transitory computer-readable recording medium recorded with a program executable by a computer to perform processing that includes: determining a state of a make-and-break relay based on a potential difference between a first terminal and a second terminal of a dark current generation circuit and a current between a second terminal of a load and a second electrode of a direct current source, the dark current generation circuit generating a dark current by lowering a voltage of the direct current power source, in a state in which the first terminal of the dark current generation circuit is connected to the first electrode of the direct current power source and the second terminal of the dark current generation circuit is connected to the first terminal of the load, so as to be parallel to the make-and-break relay that is configured to either make or break conduction between the first terminal of the load and the first electrode of the direct current power source, controlling a conductive state of a bypass circuit configured to dissipate some of power supplied from an external charger in a state of conduction between the second electrode of the direct current power source and the first terminal of the load in response to the potential difference being less than a predetermined threshold voltage and the current being less than a predetermined threshold current; and determining a state of the make-and-break relay and whether or not the direct current power source is being charged by the external charger based on the detected potential difference between the second terminal and the first terminal of the dark current generation circuit and the detected current between the second terminal of the load and the second electrode of the direct current power source in response to a conductive state being in place between the second electrode of the direct current power source and the first terminal of the load due to the bypass circuit.

In the non-transitory computer-readable recording medium recorded with a program executable by a computer to perform processing of the tenth aspect, dissipating some of the power supplied from the external charger using the bypass circuit enables an operating diagnosis of the first switcher configuring the make-and-break relay to be performed, even in a state in which the external charger is connected.

The power source control device, the power source control method, and the non-transitory computer-readable recording medium recorded with a power source control program of the present disclosure enable an operating diagnosis of the make-and-break relay to be performed, even in a state in which the external charger is connected.

The invention claimed is:

1. A power source control device comprising:
   a make-and-break relay configured to either make or break conduction between a first terminal of a load and a first electrode of a direct current power source;
   a dark current generation circuit configured to generate a dark current by lowering a voltage of the direct current power source, in a state in which a first terminal is connected to the first electrode of the direct current power source and a second terminal is connected to the first terminal of the load so as to be parallel to the make-and-break relay; and
   a bypass circuit configured to dissipate some of power supplied from an external charger by making conduction between a second electrode of the direct current power source and the first terminal of the load in response to the direct current power source being charged by the external charger.

2. The power source control device of claim 1, further comprising:
   a memory; and
   a processor coupled to the memory, the processor being configured to:
     detect a potential difference between the second terminal and the first terminal of the dark current generation circuit,
     detect a current between a second terminal of the load and the second electrode of the direct current power source, and
     control the make-and-break relay so as to make or break conduction, and determine a state of the make-and-break relay based on the potential difference and the current that have been detected.

3. The power source control device of claim 2, wherein the processor is configured to determine that the make-and-break relay is in an open state in response to the detected potential difference being a predetermined threshold voltage or greater.

4. The power source control device of claim 2, wherein the processor is configured to determine that the make-and-break relay is stuck in a closed state in response to the detected potential difference being less than a predetermined threshold voltage and the detected current being a predetermined threshold current or greater.

5. The power source control device of claim 2, wherein:
   the bypass circuit includes a switch that makes or breaks conduction between the first terminal of the load and the second electrode of the direct current power source, and a resistor that dissipates some of the conducted power; and the processor is configured to, in response to the detected potential difference being less than a predetermined threshold voltage and the detected current being less than a predetermined threshold current, make conduction between the second electrode of the direct current power source and the first terminal of the load by turning on the switch.

6. The power source control device of claim 5, wherein the processor is configured to determine that charging of the direct current power source is being performed by the external charger in response to the detected current being the predetermined threshold current or greater, in a state in which the bypass circuit is conducting between the second electrode of the direct current power source and the first terminal of the load.

7. The power source control device of claim 5, wherein the processor is configured to determine that the make-and-break relay is in an open state in response to the detected current being less than the predetermined threshold current and the detected potential difference being the predetermined threshold voltage or greater, in a state in which the bypass circuit is conducting between the second electrode of the direct current power source and the first terminal of the load.

8. The power source control device of claim 5, wherein the processor is configured to determine that the make-and-break relay is stuck in a closed state in response to the detected current being less than the predetermined threshold current and the detected potential difference being less than the predetermined threshold voltage, in a state in which the bypass circuit is conducting between the second electrode of the direct current power source and the first terminal of the load.

9. The power source control device of claim 1, wherein the make-and-break relay is installed to a vehicle.

10. A power source control method comprising:
by a processor,
detecting a potential difference between a second terminal and a first terminal of a dark current generation circuit, the dark current generation circuit being configured to generate a dark current by lowering a voltage of a direct current power source in a state in which the first terminal of the dark current generation circuit is connected to a first electrode of the direct current power source and the second terminal of the dark current generation circuit is connected to a first terminal of a load, so as to be parallel to a make-and-break relay configured to either make or break conduction between the first terminal of the load and the first electrode of the direct current power source;
detecting a current between a second terminal of the load and a second electrode of the direct current power source;
determining a state of the make-and-break relay based on the potential difference and the current;
setting a conductive state for a bypass circuit that is configured to dissipate some of power supplied from an external charger in a state of conduction between the second electrode of the direct current power source and the first terminal of the load in response to the potential difference being less than a predetermined threshold voltage and the current being less than a predetermined threshold current; and determining a state of the make-and-break relay and whether or not the direct current power source is being charged by the external charger based on the detected potential difference between the second terminal and the first terminal of the dark current generation circuit and the detected current between the second terminal of the load and the second electrode of the direct current power source in response to a conductive state being in place between the second electrode of the direct current power source and the first terminal of the load due to the bypass circuit.

11. The power source control method of claim 10, further comprising
determining that the make-and-break relay is in an open state in response to the detected potential difference being a predetermined threshold voltage or greater.

12. The power source control method of claim 10, further comprising
determining that the make-and-break relay is stuck in a closed state in response to the detected potential difference being less than a predetermined threshold voltage and the detected current being a predetermined threshold current or greater.

13. A non-transitory computer-readable recording medium recorded with a program executable by a computer to perform processing comprising:
determining a state of a make-and-break relay based on a potential difference between a first terminal and a second terminal of a dark current generation circuit and a current between a second terminal of a load and a second electrode of a direct current source, the dark current generation circuit generating a dark current by lowering a voltage of the direct current power source, in a state in which the first terminal of the dark current generation circuit is connected to the first electrode of the direct current power source and the second terminal of the dark current generation circuit is connected to the first terminal of the load, so as to be parallel to the make-and-break relay that is configured to either make or break conduction between the first terminal of the load and the first electrode of the direct current power source,
controlling a conductive state of a bypass circuit configured to dissipate some of power supplied from an external charger in a state of conduction between the second electrode of the direct current power source and the first terminal of the load in response to the potential difference being less than a predetermined threshold voltage and the current being less than a predetermined threshold current; and
determining a state of the make-and-break relay and whether or not the direct current power source is being charged by the external charger based on the detected potential difference between the second terminal and the first terminal of the dark current generation circuit and the detected current between the second terminal of the load and the second electrode of the direct current power source in response to a conductive state being in place between the second electrode of the direct current power source and the first terminal of the load due to the bypass circuit.

14. The non-transitory computer-readable recording medium of claim 13, wherein the processing further comprises
determining that the make-and-break relay is in an open state in response to the detected potential difference being a predetermined threshold voltage or greater.

15. The non-transitory computer-readable recording medium of claim 13, wherein the processing further comprises
 determining that the make-and-break relay is stuck in a closed state in response to the detected potential difference being less than a predetermined threshold voltage and the detected current being a predetermined threshold current or greater.

* * * * *